United States Patent [19]

Kugimiya et al.

[11] Patent Number: 4,900,393
[45] Date of Patent: Feb. 13, 1990

[54] PROCESS FOR PRODUCING SINGLE-CRYSTAL CERAMICS

[75] Inventors: Koichi Kugimiya; Ken Hirota, both of Toyonaka; Keiichi Matsuyama, Miyazaki, all of Japan

[73] Assignee: Matsushita Electric Industrial Co., Ltd., Osaka, Japan

[21] Appl. No.: 361,774

[22] Filed: May 26, 1989

Related U.S. Application Data

[63] Continuation of Ser. No. 62,520, Jun. 17, 1987, abandoned.

[30] Foreign Application Priority Data

Jul. 1, 1986 [JP] Japan ................... 61-154503

[51] Int. Cl.$^4$ .............................. C30B 1/02
[52] U.S. Cl. ........................ 156/600; 156/603
[58] Field of Search ............ 156/600, 603; 501/86

[56] References Cited

U.S. PATENT DOCUMENTS 4,339,301 7/1982 Matsuzawa et al. ............ 156/603
4,519,870 5/1985 Matsuzawa et al. ............ 156/603

FOREIGN PATENT DOCUMENTS 50-139709 11/1975 Japan.
51-112800 10/1976 Japan.

OTHER PUBLICATIONS

"Boundary Migration of Single Crystal in Polycrystalline Alumina"; Yugyo-Kyokai-Shi, vol. 82, [5], 1974, pp. 295-296.

Primary Examiner—William R. Dixon, Jr.
Assistant Examiner—Anthony J. Green
Attorney, Agent, or Firm—Stevens, Davis, Miller & Mosher

[57] ABSTRACT

The invention provides a process for causing growth of single crystal from the junction of a single crystal/polycrystal joined body by a low-temperature heat treatment by making use of the solid-phase growth of crystal. The growth of single crystal can be accomplished staby, with high reliability and in a solid phase by producing a stage satisfies the conditions for abnormal grain growth only at the portion close to the junction, that is, a state in which the joined body is locally kept higher than the grain growth temperature, by making use of the temperature gradient at the junction or the corresponding concentration of the additive.

9 Claims, 4 Drawing Sheets

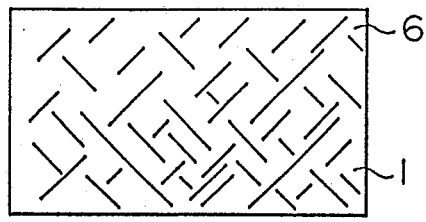
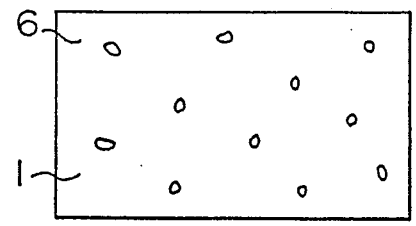
FIG. 9a          FIG. 9b
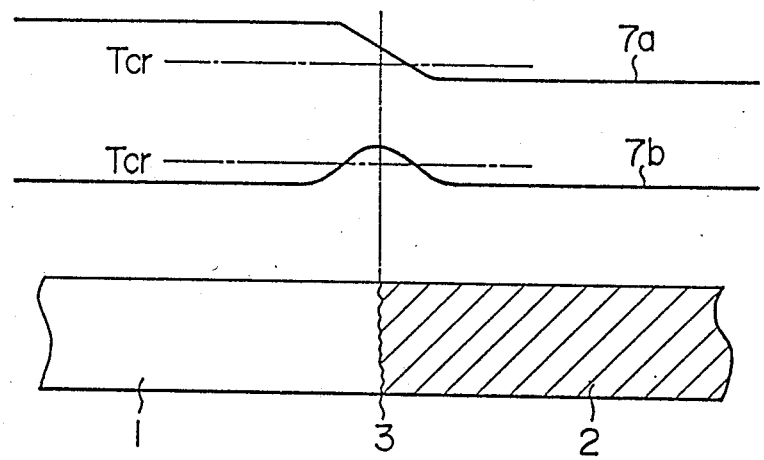
FIG. 10

PROCESS FOR PRODUCING SINGLE-CRYSTAL CERAMICS

This application is a continuation of application Ser. No. 062,520, filed June 17, 1987 now abandoned.

BACKGROUND OF THE INVENTION

This invention relates to a process for producing single-crystal ceramics from polycrystal ceramics.

For the production of single-crystal ceramics, there are known the classical techniques such as Bridgman's method in which the molten material is cooled gradually from an end, and the Czochralski method in which the seed crystals are drawn up and used as nuclei for forming single crystals.

According to these classical fusion methods, high-temperature heating is required, and in the case of a material with an extremely high melting point such as ceramics, many difficulties are involved in the production process and it is also very difficult to obtain single crystals which are generally uniform in composition, and residual stress free so as to be worked easily.

These problems can be avoided by the partial melting method, but this method has the serious disadvantage that it is unable to produce forms of products other than very thin single crystal films.

Recently, there has been proposed a new partial melting method in which only part of a polycrystal body is melted to turn it into single crystal (Japanese Patent Publication No. 9278/86) and a solid-phase growth method in which high purity polycrystal ceramics are turned into single-crystal ceramics without melting the whole of the starting material (Japanese Patent Publication Nos. 1391/86 and 3313/86).

The solid-phase growth method has greatly improved the defects of the melting methods described above, but it requires a material of very high purity and also involves great difficulties in controlling the abnormal grain growth for making good use thereof. Stable solid-phase growth takes place as far as the grain growth occurs only at the interface 3 of single crystal 1 and polycrystal 2 as shown in FIG. 4(a), but among a host of polycrystal grains, there are many of those which become nuclei and make an abnormal growth as shown by 4, obstructing the normal grain growth as shown in FIG. 4(b). Ceramics are a product obtained by crushing, mixing and firing a mixture of materials, so that microscopic non-uniformity is a natural occurrence to them and perfect uniformity can hardly be expected of them. It has been disclosed that, in order to attain very extensive solid-phase growth, the workpiece must be maintained at a temperature which is only 10° C. below the solid-phase growth temperature for a long time, but it is very difficult to maintain such uniform temperature of about 10° C. below the solid-phase growth temperature. Further, ceramics tend to be contaminated by impurities in the step of mixing and exhibit increases in impurity concentration locally, and it is a well known fact that the higher the purity of the materials used, the stronger becomes the influence of such contaminants, resulting in more pronounced non-uniformity of the ceramics.

SUMMARY OF THE INVENTION

The present invention has for its object to solve the problems in the solid-phase growth method which can be practiced at a relatively low temperature and scarcely suffers from compositional variation, especially such problems as barely balanced suppression of abnormal grain growth, critically difficult control of solid-phase growth of crystal and very strict conditions for such solid-phase growth due, for one thing, to high purity of the material. The invention is intended not only to overcome the great difficulties involved in controlling the abnormal grain growth, especially when an additive or impurity is present, but also to turn such phenomenon (abnormal grain growth) to an advantage.

It is also envisaged in this invention to realize and offer a new technique which makes it possible to produce, with ease, the columnar giant single crystals or the single crystals having inclusions, which crystals have been difficult to obtain with the prior art.

The process for producing single-crystal ceramics according to this invention comprises a step in which a smooth face of polycrystal ceramics is placed in opposition to a corresponding smooth face of single-crystal ceramics having substantially the same composition as the polycrystal ceramics, and they are secured to each other with an adhesive layer placed therebetween, said layer containing at least one abnormal grain growth promoting element, an amount which exceeds that of said abnormal grain growth promoting element in said polycrystal ceramics; a step of heat treatment conducted by heating the assembly to a bonding temperature at which said adhesive layer begins to diffuse and the opposing smooth faces of said polycrystal and single-crystal ceramics are directly contacted and bonded to each other; and a solidphase growth step in which further heating is conducted while maintaining the diffusion and solid-phase growth equilibrating temperature which is intentionally designed to be lower than the abnormal grain growth temperature of the polycrystals (the temperature causing abnormal grain growth of polycrystal ceramics), and higher than said bonding temperature.

BRIEF DESCRIPTION OF THE DRAWINGS

FIGS. 8 and 9(a) and (b) illustrate the examples of its application.

FIG. 10 is a basic illustration of a process forming a giant single crystal with ease by applying the basic technique of this invention.

DETAILED DESCRIPTION OF THE INVENTION

Figure 1:
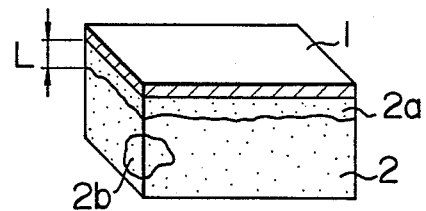
FIG. 1 is a sectional view showing the process for producing single-crystal ceramics in an embodiment of this invention.

In the process of producing oxide single crystals by the so-called solid-phase single crystal growth method in which single crystal and polycrystal are joined and heat treated, a polycrystal is made by an ordinary ceramics-producing method and used as a starting material. FIG. 1 illustrates the single crystal producing process in an embodiment of this invention. In the drawing, 1 designates a single crystal and 2 a polycrystal which is to be worked into single crystal. 2a indicates the portion of polycrystal 2 which has been made into a single crystal. L denotes the length of portion $2a$ measured from the original interface between single crystal grains which have grown from the face of polycrystal 2.

Figure 2:
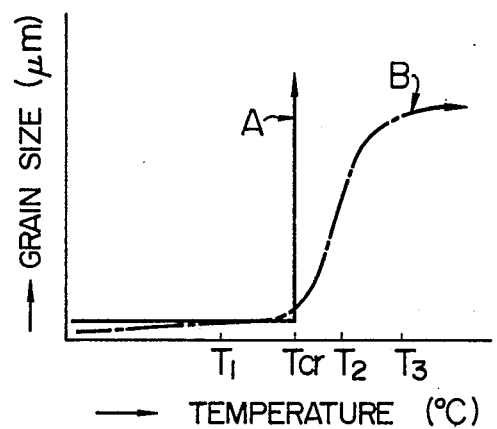
FIG. 2 is a graph showing the relationship between heating temperature and average grain size.

The average grain size (μm) of the abnormal grain growth promoting element polycrystal after 3-hour heating at the various temperatures is shown by curve B in FIG. 2. A in FIG. 2 indicates the ideal "abnormal grain growth" described in Japanese Patent Application Kokai (Laid-Open) No. 162496/80.

Figure 3:
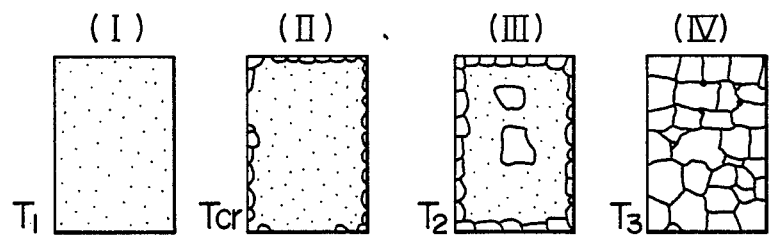
FIGS. 3 and 4(a) and (b) are the sectional views illustrating the concepts of abnormal grain growth and solid-phase growth, respectively.

FIG. 3 illustrates the pattern of growth of grains in a single body of the polycrystal represented by curve B in FIG. 2. FIG. 3(I), (II), (III), and (IV) illustrate schematically a section of an inside portion of the polycrystal at the temperatures of $T_1$, Tcr (abnormal grain growth temperature), $T_2$ and $T_3$, respectively, shown in FIG. 2. Tcr is the temperature at which the polycrystal used in this invention starts its grain growth abruptly, that is, the temperature at which the grain growth for forming a giant crystal begins. $T_1$ is the temperature which is about 20° C. to 50° C. lower than Tcr. $T_2$ is the temperature which is intermediate between Tcr and $T_3$. At this temperature $T_2$, the surface of the polycrystal where the grain growth tends to take place is entirely covered with the giant grains, and also the giant grains are formed inside. $T_3$ is the temperature at which the polycrystal is entirely composed of the giant grains.

The polycrystal as shown by curve A in FIG. 2 shows almost no sign of grain growth until the temperature reaches Tcr, but when the temperature reaches Tcr, there suddenly takes place the grain growth, when the giant grains take up the surrounding fine grains. Such grain growth is not limited to the surfaces of the polycrystal but it equally occurs in the inside of the polycrystal, too. Thus, this results in critical control of the temperature for the solid-phase growth.

The present inventors have developed a new process for producing oxide single crystal with good controllability, not by using the very pure polycrystal showing the nearly ideal abnormal grain growth as represented by curve A, but by using a polycrystal with the abnormal grain growth promoting element showing the ordinary and relatively stable pattern of grain growth as indicated by curve B. Use of the polycrystal represented by curve B makes it possible to employ a higher heat treatment temperature for recrystallization than when using the polycrystal represented by curve A. Thus, a higher single-crystallization speed is realized in this invention. This will be made clearer by experiments as described in aforementioned Japanese Patent Application Kokai (Laid-Open) No. 162496/80, i.e., when the single crystal/polycrystal combination having the feature represented by curve A in FIG. 2 is subjected to a heat treatment at the temperature $T_1$, which is below Tcr but not lower by about 100° C. than Tcr, there takes place almost no grain growth and an exceedingly long time is required for the growth of single crystal as shown in FIG. 2, and when the said combination is subjected to a heat treatment at a temperature of Tcr or higher, very wild grain growth takes place resulting in a grain growth as a whole as shown in FIG. 3 (IV).

Figure 4A:
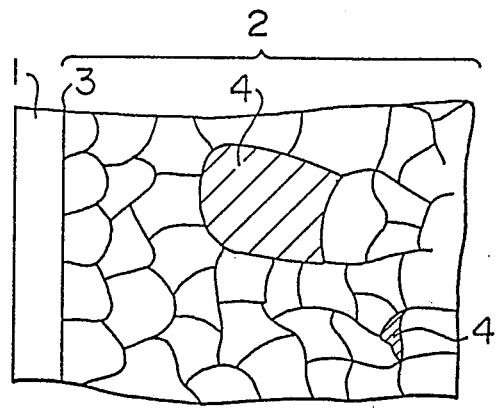
Figure 4B:
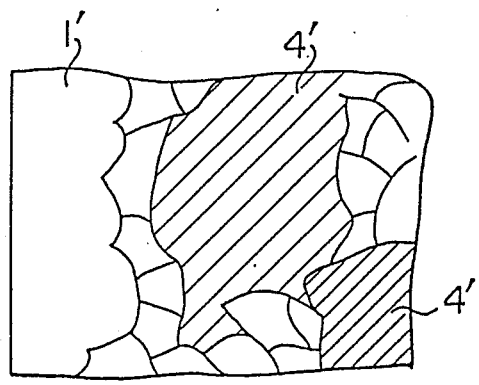

This could be easily understood if one considered the case of causing a single crystal growth, when a thin piece of single crystal 1 is set and attached (as at 3) to a polycrystal 2 as shown in FIG 4(a). By a heat treatment at the temperature of Tcr or higher, there takes place the growth of the single crystal as shown in FIG. 4(b), but at the same time the abnormal grain growth 4' begins from the nuclei 4 of grain growth (large-sized grains, impurities, surface, etc.) to obstruct the growth of the single crystal.

In order to eliminate such growth obstructive factors, the present invention features the idea of providing a temperature gradient which enables the crystal growth in one direction, or providing a gradient of Tcr that can produce a similar effect.

Figure 5:
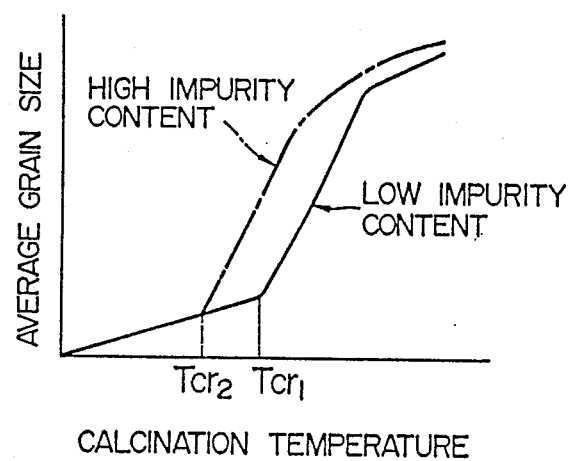
FIGS. 5, 6 and 7 illustrate the basic technical concept of this invention.

Generally, the abnormal growth of polycrystal is greatly varied in its pattern by the presence of the critical amount of additives or impurities as explained as follows. In some cases, the presence of only a trace amount, such as about 5 ppm, of an additive or impurity may produce an effect of promoting abnormal grain growth, and in other cases, the grain growth may be inhibited by the presence of such trace amount of the additive or impurity, but the abnormal grain growth is promoted when the amount of such additive or impurity becomes greater than the critical value, generally 200 ppm. The polycrystal ceramics contain at least one abnormal grain growth additive at a concentration lower than the concentration of its solubility limit but higher than the critical abnormal grain growth concentration. In this case, there takes place a sharp change of pattern of grain growth when the annealing temperature is above Tcr (abnormal grain growth temperature). It is also seen that Tcr lowers as the amount of the additives increases as shown by $Tcr_1$ and $Tcr_2$ as shown in FIG. 5. Thus, there is produced a gradient of Tcr in accordance with the concentration gradient.

Figure 6:
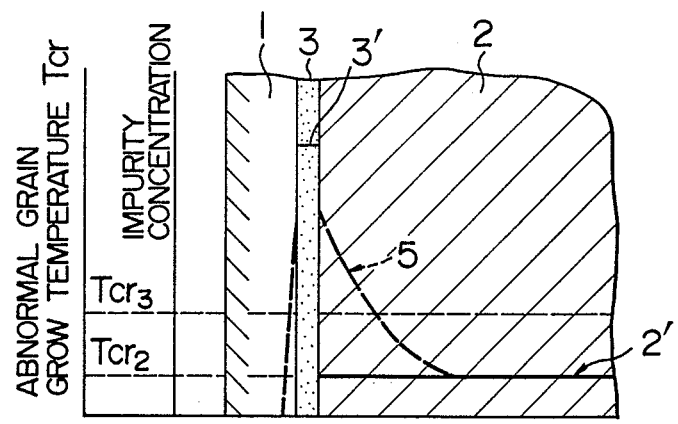
Figure 7:
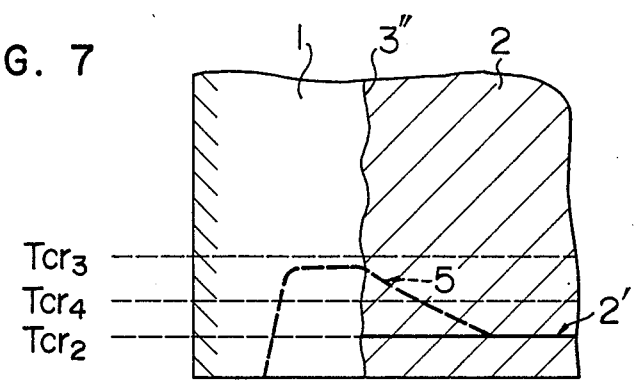

As shown in FIG. 6, a piece of single crystal 1 and a polycrystal body 2 are placed opposing to each other and joined with an adhesive layer 3 interposed therebetween, the adhesive layer 3 containing a large amount of an abnormal grain growth promoting element which is diffused by heating. The concentration 3' of the element is depicted schematically in the illustration of adhesive layer 3. This corresponds reversely to the high and low indication of Tcr on the leftside vertical axis in FIG. 6. The polycrystal 2 also contains an abnormal grain growth promoting element 2' for promoting the solid-phase growth of the polycrystal 2 to effect a great expansion thereof. (As apparent from the following description, it is not always necessary to contain an abnormal grain growth promoting element in the polycrystal). Then, a heat treatment is conducted at a temperature which is far lower than $Tcr_2$ of the polycrystal 2. Naturally, there takes place no abnormal grain growth. Regarding the adhesive layer 3, the impurity contained therein is diffused only slightly into the single crystal 1 but deeply diffused by grain boundary diffusion into the polycrystal 2 as shown by a broken line 5. Thus, as said adhesive layer 3 is diffused, the single crystal and polycrystal 2 are brought into contact with each other and bonded to form a junction. At the same time, the high concentration region of impurity is defined by the broken line 5. Tcr in this region is very low as explained in relation to FIG. 5, so that if it is kept at $Tcr_3$, there begins the abnormal growth, namely solid-phase growth of the single crystal from the junction. Owing to rapid diffusion at the grain boundaries and the impurity sweep-out effect thought to be caused concomitant to the solid-phase growth, the additive is diffused into the polycrystal 2, followed by the solid-phase growth in its wake. After the diffusion and solid-phase growth have occurred to a certain extent in the manner described above, there is produced a state such as shown in FIG. 7, in which the additive concentration at the interface 3" becomes low, that is, $Tcr_4$ of said additive concentration, $Tcr_4$ becomes higher than $Tcr_3$, and at the current heat treatment temperature $Tcr_3$, there takes place no further solid-phase growth. Because the diffusion continues, the additive concentration is further lowered. In such state, however, it is possible to let the solid-phase growth proceed by raising the temperature correspondingly, that is, by resetting the temperature higher to $Tcr_2$, in other words, by bringing the temperature to $Tcr_4$ which becomes a new solid-phase growth equilibrating condition.

As apparent from the foregoing explanation, it is clearly shown that, for producing single-crystal ceramics, at least one abnormal grain growth promoting element is to be contained in an adhesive layer 3 and that the amount of said abnormal grain growth promoting element in the adhesive layer should be greater than that in the polycrystal 2, as shown in FIGS. 6 and 7 and also explained above as a very extreme case. As also apparent from the previous explanation, the solid-phase growth proceeds with the concentration gradient generated by diffusion, so that such solid-phase growth takes place in one direction even if the temperature is lower or slightly higher than Tcr at the interfacial concentration, and even though the temperature is fairly lower than $Tcr_2$ of the polycrystal 2, no abnormal grain growth such as shown in FIGS. 3 and 4 takes place from inside of the polycrystal 2. Rather, by setting the temperature higher than Tcr at the interfacial concentration (viz. far lower than $Tcr_2$ of the polycrystal), a very rapid solid-phase growth can be effectuated. As will be understood from the foregoing explanation, the process suffers from no impediment even if the background additive concentration 2' in the polycrystal 2 such as shown in FIG. 6 is null. The presence of such background additive, however, leads to an advantage that the amount of the additive 3' in the adhesive layer 3' which could be reduced by diffusion and left in the single crystal, can be reduced.

In the present invention, as explained above, an abnormal grain growth promoting element is added in a large amount to the junction, and by making use of a large drop of the abnormal grain growth temperature Tcr corresponding to the additive concentration that is changed by diffusion, the solid-phase growth is allowed to take place in one direction along the concentration gradient region at a low temperature. At the high-concentration region, it is possible to attain a high abnormal growth rate by keeping the heating temperature higher than Tcr, and further this Tcr is far lower than the Tcr of the polycrystal to be made into a single crystal. This is a key feature of the present invention.

In the following embodiment of the invention, an application of the above-described principle of the invention to MnZn ferrites, a typical example of the materials particularly useful for the production of electroceramics, will be described in detail.

A single-crystal ferrite composed essentially of 55% by mole of $Fe_2O_3$, 30% by mole of MnO and 15% by mole of ZnO was used as a seed. There were also prepared polycrystal ferrites of almost the same composition. The materials used for the preparation of these ferrites were all of a high purity. After adding 2 to 500 ppm of additive when necessary, powdery materials were mixed well, and the mixtures were molded, compacted by pressing under hydrostatic pressure and fired in a 1% $O_2$ atmosphere at 1,250° C. The obtained polycrystal bodies had a porosity of less than 0.01% and a grain size of 3 to 15 μm.

Next, the single-crystal ferrite 1, which had been cut to a size of 15 mm x 30 mm x 0.5 mm and polished to a flat face, was placed on a similarly polished 15 mm x 30 mm x 10 mm polycrystal ferrite 2 and bonded together in the manner shown in FIG. 1. The bonding was effected by applying various types of liquid adhesive including those comprising an acid alone as used in the prior art, water glass containing various kinds of additives, ethyl silicate, etc. The combination of said materials used are shown in Table 1.

The bonding temperature usable for the joining treatment ranges from 1,000° C. to 1,300° C., but in the following examples, said treatment was conducted at 1,250° C. for one hour. After this treatment, the adhesive layer substantially disappeared leaving a slight remnant, indicating that the adhesive layer had been substantially diffused in the polycrystal. There was the case where the solid-phase growth had already commenced in part though very slight in degree (less than 0.3 mm). The solid-phase growth was effectuated by heating at a temperature of 1,300° C. to 1,450° C. The heat treating time was approximately 6 hours, and a 3% $O_2$ atmosphere was used for the treatment. In the column of "Heat treatment" in Table 1, the numerical representation of "1300(3)–1350(4)" signifies that the heat treatment was carried out by first heating at 1,300° C for 2 hours at a heating rate of 100° C./hr and then further heating at 1,350° C. for 4 hours. "Amount of solid-phase growth (mm)" is L in average in FIG. 1, and "Polycrystal Tcr" indicates the abnormal grain growth temperature of the polycrystal itself.

TABLE 1

| | Adhesive layer | | In polycrystal | | Poly-crystal Tcr (°C.) | Heat treatment °C. (hr) | Amount of solid-phase growth (mm) |
|---|---|---|---|---|---|---|---|
| | Impurity | Layer thickness (μm) | Additive (ppm) | Grain size (μm) | | | |
| 1 | | | 0 | 10 | 1450 | 1400(6) | 1 |
| 2 | | | 0 | 16 | 1450 | 1420(6) | 2 |
| 3 | | | 0 | 5 | 1450 | 1350(6) | 0 |
| 4 | $B_2O_3$ | 1 | 0 | 10 | 1450 | 1300(6) | 4 |
| 5 | $SiO_2$ | 1 | 0 | 10 | 1450 | 1350(6) | 3 |
| 6 | $Nb_2O_5$ | 1 | 0 | 10 | 1450 | 1300(6) | 3 |
| 7 | $V_2O_5$ | 1 | 0 | 10 | 1450 | 1350(6) | 2 |
| 8 | $Bi_2O_3$ | 1 | 0 | 10 | 1450 | 1300(6) | 2 |
| 9 | $SiO_2$ | 1 | $Na_2O$ 500 | 10 | 1340 | 1250(3)–1300(3) | 3 |
| 10 | $B_2O_3$ | 1 | $Na_2O$ 500 | 10 | 1340 | 1250(3)–1300(3) | 3 |
| 11 | $SiO_2$ | 1 | $SiO_2$ 450 | 20 | 1360 | 1340(6) | 5 |
| 12 | $B_2O_3$ | 1 | $SiO_2$ 450 | 20 | 1360 | 1340(6) | 5 |
| 13 | $B_2O_3$ | 1 | $SiO_2$ 450 | 20 | 1360 | 1300(2)–1340(4) | 6 |
| 14 | $SiO_2$ | 1 | $B_2O_3$ 20 | 20 | 1400 | 1320(2)–1400(4) | 8 |

TABLE 1-continued

| | Adhesive layer | | In polycrystal | | Poly- | Heat | Amount of |
|---|---|---|---|---|---|---|---|
| | Layer | | | | crystal | treatment | solid-phase |
| Impurity | thickness (μm) | Additive (ppm) | | Grain size (μm) | Tcr (°C.) | °C. (hr) | growth (mm) |
| 15 $B_2O_3$ | 1 | $B_2O_3$ 20 | | 20 | 1400 | 1320(2)–1400(4) | 9 |
| 16 $SiO_2$ | 1 | $B_2O_3$ 30 | | 20 | 1380 | 1320(2)–1360(4) | 6 |

In Table 1, 1 to 3 are the prior art examples in which, as seen from the table, the growth rate is low. In these examples, the growth rate was slow because of the low heat treating temperature. At the high heat treatment, the abnormal grain growth takes place normally in the polycrystal to retard the solid-phase growth.

On the other hand, satisfactory solid-phase growth was seen in any of the examples (4 to 16) of this invention. It is also apparent that the addition of the additive in the polycrystal was conducive to the increase of growth rate, as also described below.

Another embodiment of this invention as applied to a ferrite having the final composition of 32 mol % MnO, 16 mol % ZnO and 52 mol % $Fe_2O_3$ is described below.

Special grade $MnCO_3$, special grade ZnO and $Fe_2O_3$ of 99.9% purity were blended so that the total amount would become 2 kg, and then 0.10% by weight of $Nb_2O_5$, 0.1% by weight of $SiO_2$, 0.05% by weight of $V_2O_5$, 0.05% by weight of $Bi_2O_3$ and 0.003% by weight of $B_2O_3$ were added to the blend to form five different mixtures. These five mixtures were wet mixed by a stainless steel ball mill for 15 hours and then calcinated in air at 900° C. for 2 hours. This was followed by additional 15-hour wet mixing in the ball mill, and the obtained mixture was dried at 130° C. for 10 hours. The resulting dry powder was added with 12 to 15% by weight of pure water and granulated by a mixing machine, and further molded under a pressure of 300 kg/cm$^2$.

The molded body was hot pressed in the air at 1,280° C. under a pressure of 300 kg/cm$^2$ for 3 hours to obtain a sintered body having an average crystal grain size of 20 μm and a porosity of less than 0.01%. For the purpose of comparison, a sample with none of the additives was hot pressed in the same way as described above to obtain a sintered body having an average grain size of 25 μm and a porosity of less than 0.02%.

These two types of polycrystal were cut to a size of 30×20×15 mm by a diamond cutter, and the 30×20 mm face, which is to become the joining face, was polished with #2,000-mesh and #4,000-mesh SiC abrasive grains successively, followed by polishing with a 3 μm-diameter diamond abrasive. On the other hand, an Mn-Zn ferrite single crystal of the same composition as said polycrystal was cut into a 1.5 mm thick single crystal plate with the 30×20 mm face as (100) plane and two side faces as (110) planes, and as in the case of said polycrystal, the 30×20 mm face was selected as the joining face and polished in the same way as described above. Thin silica sol and 1 N $HNO_3$ were applied to the joining faces of said single crystal and polycrystal, and the single crystal was bonded to the different types of polycrystal to form six single-crystal/polycrystal joined bodies.

Each of these six joined bodies was subjected to a 3-hour heat treatment in an $N_2$ gas-flowed atmosphere at temperatures of 1,280° C., 1,300° C., 1,320° C. and 1,340° C., respectively, to effect single-crystallization of the joined bodies.

Before conducting the above operations, the present inventors had examined the manner of grain growth in relation to temperature concerning said six types of polycrystal and confirmed that those to which were added $Nb_2O_5$, $SiO_2$, $V_2O_5$, $Bi_2O_3$ or $B_2O_3$ exhibited a pattern of grain growth shown by curve B in FIG. 2 and that Tcr=1,300° C. in the case of these polycrystals. It had been also confirmed that there takes place continuous grain growth (normal grain growth) in the polycrystals without said additives.

After the single-crystallization heat treatment, each of the obtained crystal structures was cut across the central portion thereof and the cross section was mirror polished and etched to measure the single-crystallization length L. In the case of the samples using the polycrystals which had added thereto $Nb_2O_5$, $SiO_2$, $V_2O_5$, $Bi_2O_3$ or $B_2O_3$, L=0.5 mm at the heat treating temperature of 1,280° C., L=1.0 mm at 1,300° C., L=7 to 8 mm at 1,320° C., and L=7 to 8 mm at 1,340° C. In the case of the samples using the polycrystals with no additive, L was about 0.5 mm at any of said heat treating temperatures. It was thus learned that the single-crystallization could be accomplished to the maximum degree in case of using the polycrystals which had added thereto $Nb_2O_5$, $SiO_2$, $V_2O_5$, $Bi_2O_3$ or $B_2O_3$ and when the heat treatment was conducted at a temperature slightly higher than Tcr.

Examinations of the magnetic properties of the portion which was turned into single crystal from polycrystal containing $Nb_2O_5$, $SiO_2$, $V_2O_5$, $Bi_2O_3$ or $B_2O_3$ showed that the magnetic permeability $\mu_{1K}$ at a frequency of 1 KHz was 10,000 and the coercive force Hc was 0.05 Be. These values are equal to those of the single-crystal Mn-Zn ferrite of the same composition produce attest to the excellent properties of the single-crystallized products according to this invention.

Figure 8:
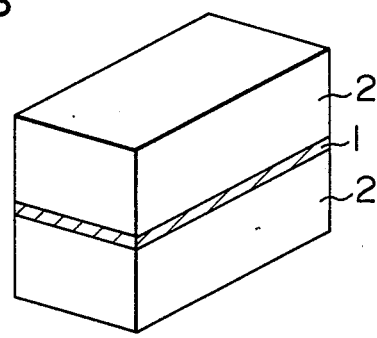

In the above embodiment, the seed single crystal was joined on top of the polycrystal. In case the seed single crystal was disposed and joined between two polycrystals as shown in FIG. 8 and this joined body was subjected to the same treatments and tests as described above, there were obtained the same results as in the above embodiment. In this case, the single crystal expands to both sides, doubling in the length of single-crystallized portion as compared to the above embodiment where grain growth occurs at one side.

Next, the effects of the different types of the additives and their concentrations to other forms of oxide polycrystals will be described.

Selected for use as additives were MgO, $SiO_2$, $Nb_2O_5$, $V_2O_5$, $Bi_2O_3$, $B_2O_3$, $CaCO_3$, $Al_2O_3$, $TiO_2$, $Cu_2O$, NiO and $Cr_2O_3$, and to each of these compounds was added, in an amount of 0.001 to 1.0% by weight, each of the oxide polycrystals of $Al_2O_3$, $LiNbO_3$, ferrite, $Y_3Al_5O_{12}$ (YAG) and $Y_3Fe_5O_{12}$ (YIG). The oxide polycrystals added with $Nb_2O_5$, $SrO_2$, $V_2O_5$, $Bi_2O_3$ or $B_2O_3$ had high density, showed good sinterability and could be reduced in grain size to less than 30 μm, and, when they were subjected to the heat treatment, they showed grain growth of the pattern expressed by curve B in FIG. 2.

When these polycrystals were joined to a single crystal and heat treated under the conditions pertinent to the respective polycrystals, single crystallization proceeded from the single crystal side toward the polycrystal side. The polycrystals not added with $Nb_2O_5$, $SiO_2$, $V_2O_5$, $Bi_2O_3$ or $B_2O_3$ were slightly lower in density than, and also inferior in sinterability to, those added with said compounds. Further, the non-added polycrystals were larger in grain size than those added with said compounds, and when heat treated, the former showed so-called normal grain growth in which the grain size enlarges proportionally to the heating temperature. When these non-added polycrystals were joined to a single crystal and heat treated, they showed almost no sign of conversion into single crystal or were only slightly converted into single crystal, if at all.

Further examinations were made on the content of said additives ($Nb_2O_5$, $SiO_2$, $V_2O_5$, $Bi_2O_3$ and $B_2O_3$) to ferrites. These additives were added in an amount of 0.001 to 1.0% by weight when mixing said respective oxides in the starting material, and the mixtures were molded and fired to obtain the polycrystal samples. The average grain size of these polycrystal samples, the manner of grain growth in heat treatment and the manner of single-crystallization of the polycrystals when joined to a single crystal and heat treated were examined.

In the case of $Nb_2O_5$, when its content in the polycrystal was less than 0.05% by weight, the grain growth in said polycrystal was not of the mode shown by curve B in FIG. 2 but continuous grain growth (normal grain growth) took place, while when the content of said compound exceeded 0.5% by weight, it was difficult to control the grain growth. Further, in case the polycrystal was joined to a single crystal and heat treated, when the content of $Nb_2O_5$ was less than 0.05% by weight, there could be admitted almost no sign of single-crystallization, and when said content was over 0.5% by weight, giant grains were produced in the single-crystallized portion and no good single crystal was obtained. In this invention, therefore, the content of $Nb_2O_5$ in the polycrystal is limited to the range of about 0.05 to 0.5% by weight.

Other additives were also examined concerning their content, fine structure of the polycrystals containing them, grain growth by heat treatment and solid-phase single-crystallization in the joined bodies. As a result of examinations, it was determined that the optimum contents of these additives were as follows: $SiO_2$: 0.03–0.5% by weight, $V_2O_5$: 0.01–0.1% by weight, $Bi_2O_3$: 0.005–0.1% by weight, $B_2O_3$: 0.0003–0.1% by weight. In the case of $V_2O_5$, since the oxides of V include $V_2O_3$, the optimum content of these oxides was represented by the values for $V_2O_5$.

Next, still another example is described as follows.

Special grade $Li_2CO_3$ and $Nb_2O_5$ of 99.8% purity were blended in a total amount of 200 g so that the final composition would become $LiNbO_3$, and they were wet mixed for 15 hours in the manner of the previous embodiment. The mixed slurry was calcinated in air at 700° C. for 2 hours, and the calcinated material was again wet mixed for 15 hours. The mixed material was dried, then added with pure water of 10% by weight based on the powder of the material, and granulated, through a 20-mesh filter and molded under pressure of 1,000 kg/cm². In the same way, $Nb_2O_5$ was mixed with the powder of the calcinated material in amounts of 0.01% by weight, 0.03% by weight, 0.5% by weight and 0.7% by weight and molded. These moldings were heat treated in air at 1,000° C. for 6 hours at a heating rate of 200° C./hr to form sintered bodies of $LiNbO_3$. The average grain size of each sintered body was about 1 to 5 μm and the sinter density was 95% when no $Nb_2O_5$ was added, 95.5% when $Nb_2O_5$ was added in an amount of 0.01% by weight, 0.03% by weight or 0.05% by weight, 97% when $Nb_2O_5$ was added in an amount of 0.1% by weight or 0.3% by weight, and 97.5% when $Nb_2O_5$ was added in an amount of 0.5% by weight or 0.7% by weight. When these sintered bodies were heat treated in air, those containing no $Nb_2O_5$ additive and those added with 0.01% by weight or 0.03% by weight of $Nb_2O_5$ showed normal grain growth, and those added with 0.05% by weight, 0.1% by weight, 0.3% by weight or 0.5% by weight of $Nb_2O_5$ showed grain growth of the pattern represented by curve B in FIG. 2, while those added with 0.7% by weight of $Nb_2O_5$ had a so-called duplex structure in which the large grains and the small grains existed mixedly with each other, and showed no uniform grain growth such as shown in FIG. 3-IV.

The sintered bodies were cut and joined to a single crystal of $LiNbO_3$ prepared by the Czochralski method and heat treated for single-crystallization in the manner as described above. Since the temperature corresponding to Tcr in FIG. 2 was 1,100° C. in the aforesaid heat treatment, the heat treatment was conducted by heating the joined body at the temperatures of 1,080° C., 1,100° C., 1,120° C. and 1,180° C. for 3 hours, and the length of single-crystallization L was measured in the same way as in the previous embodiment. In the case where no $Nb_2O_5$ was added or 0.01% by weight or 0.03% by weight of $Nb_2O_3$ were added, L was about 0.5 mm at each of said heat treating temperatures (1,080° C.–1,180° C.), and in the case where 0.05% by weight, 0.1% by weight, 0.3% by weight or 0.5% by weight of $Nb_2O_5$ were added, L was about 1 to 2 mm when the heat treatment was conducted at 1,080° C. and 1,100° C. and L was 5 to 7 mm when the heat treatment was conducted at 1,120° C. and 1,180° C. In case where 0.7% by weight of $Nb_2O_5$ was added, L was 1 to 2 mm when the heat treatment was conducted at 1,080° C. and 1,100° C., and it was also 1 to 2 mm when the heat treatment was conducted at 1,120° C. and 1,180° C., and in this case, the giant grains with diameters of several hundred μm as shown in FIG. 4–6 were produced in the central portion and no satisfactory single-crystallization could be achieved.

In view of the above, it is clear that it is possible to produce the single crystals with good mass productivity by using polycrystals containing 0.05 to 0.5% by weight of $Nb_2O_5$ and by conducting the heat treatment at a temperature higher than the temperature at which giant grains of said polycrystals begin to form, that is, the temperature Tcr at which the grain growth begins suddenly.

Similar examinations were made by using other additives $SiO_2$, $V_2O_5$, $B_2O_3$ and $B_2O_3$. In the same way as in the case of $Nb_2O_5$, these additives were added to the polycrystals of $LiNbO_3$, and their content, fine structure of polycrystals and manner of grain growth and solid-phase single-crystallization were examined. As a result, it was found that the optimal content of these additives for effecting the desired single-crystallization are as follows: $SiO_2$: 0.03–0.5% by weight, $V_2O_5$: 0.01–0.1% by weight, $Bi_2O_3$: 0.005–0.1% by weight, $B_2O_3$: 0.001–0.05% by weight.

In the above embodiments of the invention, its application to the single-crystallization of ferrite $LiNbO_3$ polycrystals has been described, but it is also possible to form the single crystals of other oxides by using said additives according to the method of this invention.

When the above experiment was repeated with the increased amount of additives exceeding solubility limits in the polycrystal (i.e., additives were segregated) there was obtained a product of the structure in which the precipitate was oriented in the fixed directions as shown in FIG. 9(a). This will probably be due to the specificity of the precipitate that it always separates out along the (111) planes in ferrites.

Further, even in the case of polycrystals with no additives but having pores, it was possible to accomplish the single-crystallization with the pores left in the structure as shown in FIG. 9(b) although the single crystal growth rate was low. In such single crystals, the included pores stay independent of each other, and it is expected that such single crystals will find new applications.

From a comparative examination of said single-crystal ferrite having the very slight precipitate produced therein and the similarly grown single-crystal ferrite having no precipitate, it was found that the former is several times higher in electric resistivity than the latter and that also the former is approximately 70% higher in magnetic permeability (70–1,000 in the former) than the latter in the frequency range of 5 to 10 MHz which is required for a high density recording magnetic head, etc., these facts attesting to the very excellent magnetic properties of the former ferrite. Further, when magnetic heads for VHS were made from both of said ferrites and their properties were compared, it was found that the magnetic head made from the former ferrite was far superior in head rubbing noise to the magnetic head made from the latter ferrite, the head rubbing noise of the former in the region of 5–10 MHz being better by 1.5 dB (at 10% humidity) and by 0.5 dB (at 80% humidity) than that of the latter.

An example where the single-crystallization was conducted by providing a temperature gradient instead of concentration gradient is described below with reference to FIG. 10.

As shown in the drawing, a piece of single crystal 1 and a polycrystal body 2 was joined at 3 and heated so that the temperature distribution or temperature gradient at the junction 3 is expressed as shown by 7a or 7b. The temperature of the single crystal side, at least the portion thereof close to the junction 3, was kept higher than Tcr of the polycrystal 2, while almost of all the polycrystal body was kept below Tcr substantially in its entirety. The heat treatment caused a stable growth of single crystal, as readily understood from the foregoing descriptions. In the case of said joined body of 30 mm in width, 1.5 mm in thickness and 150 mm in length, it was possible to single-crystallize it through its full length by relatively shifting the temperature gradient portion crosswise (toward the polycrystal side) at 5 mm/hr.

It is apparent that an extraordinarily long single crystal body can be obtained according to the temperature gradient process of this invention. It is also apparent that, in accordance with said temperature gradient principle of this invention, it is possible to effect steady conversion of polycrystal into single crystal no matter whether various kinds of additives are contained in the polycrystal as described above or no additive is contained.

What is claimed is:

1. A process for producing single-crystal ceramics, consisting essentially of the steps of placing a smooth face of a single-crystal ceramic to a corresponding smooth face of a single-crystal ceramic having the substantially same composition as said polycrystal ceramic, and joining said polycrystal and single-crystal ceramics with an adhesive layer placed therebetween, said layer containing at least one abnormal grain growth promoting element in an amount which exceeds that of said abnormal grain growth element in said polycrystal ceramic; heating the assembly to a bonding temperature at which said adhesive layer begins to diffuse to let said opposing smooth faces of said polycrystal and single-crystal ceramics to come into contact and to be bonded to each other; and further heating the assembly while maintaining it at a diffusion and solid-phase growth equilibrating temperature which is lower than the abnormal grain growth temperature—the temperature at which the abnormal grain growth of said polycrystal ceramic begins—and which is higher than said bonding temperature to thereby effect solid-phase growth of crystal.

2. The process according to claim 1, wherein the said polycrystal ceramic contains at least one abnormal grain growth promoting element at a concentration higher than the critical abnormal grain growth concentration.

3. The process according to claim 1, wherein the said abnormal grain growth promoting element is at least one element selected from Nb, Si, V, Bi and B, and the content thereof is respectively 0.05 to 0.5% by weight as $Nb_2O_5$, 0.03 to 0.5% by weight as $SiO_2$, 0.01 to 0.1% by weight as $V_2O_5$, 0.005 to 0.1% by weight as $Bi_2O_3$, and 0.0003 to 0.01% by weight as $B_2O_3$.

4. The process according to claim 1, wherein the said single-crystal ceramic contains pores which are distributed entirely throughout the said starting polycrystal ceramic even after the solid-phase growth of crystal.

5. The process for producing single-crystal ceramics characterized in that substantially the whole body of a polycrystal ceramic is kept below the abnormal grain growth temperature, and that in a polycrystal ceramic, in which the solid-phase growth is to take place, at least the portion of the polycrystal ceramic close to the interface of solid-phase growth between the single-crystal ceramic and polycrystal ceramic, is kept above said abnormal grain growth temperature.

6. The process according to claim 5, wherein the solid-phase growth is allowed is allowed to proceed to the body of the polycrystal ceramic while shifting the temperature gradient portion, said temperature gradient portion varying from a temperature above the abnormal grain growth temperature to a temperature therebelow, crosswise in the said polycrystal ceramic at relatively unchanged positional relation with the interface of solid-phase growth.

7. The process according to claim 5, wherein the said polycrystal ceramic contains at least one abnormal grain growth promoting element at a concentration higher than the critical abnormal grain growth concentration.

8. The process according to claim 5, wherein the abnormal grain growth promoting element is at least one element selected from Nb, Si, V, Bi and B, and the content thereof is respectively 0.05 to 0.5% by weight the $Nb_2O_5$, 0.03 to 0.5% by weight as $SiO_2$, 0.01 to 0.1% by weight as $V_2O_5$, 0.005 to 0.1% by weight as $Bi_2O_3$, and 0.0003 to 0.01% by weight as $B_2O_3$.

9. The process according to claim 5, wherein the said polycrystal ceramic contains pores which are distributed entirely thoughout the whole body of the said polycrystal ceramic even after the solid-phase growth.

* * * * *